(12) United States Patent
Yi et al.

(10) Patent No.: US 10,177,498 B1
(45) Date of Patent: Jan. 8, 2019

(54) STACKING ELECTRICAL CONNECTOR

(71) Applicant: TE CONNECTIVITY CORPORATION, Berwyn, PA (US)

(72) Inventors: Chong Hun Yi, Mechanicsburg, PA (US); Matthew David Morrison, Lemoyne, PA (US); Christopher Rowland, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/899,180

(22) Filed: Feb. 19, 2018

(51) Int. Cl.
| *H01R 13/62* | (2006.01) |
| *H01R 13/639* | (2006.01) |
| *H01R 13/52* | (2006.01) |
| *G01R 1/04* | (2006.01) |
| *H01M 8/04537* | (2016.01) |
| *H01R 13/436* | (2006.01) |

(52) U.S. Cl.
CPC ........ *H01R 13/639* (2013.01); *G01R 1/0416* (2013.01); *H01M 8/04552* (2013.01); *H01R 13/4365* (2013.01); *H01R 13/5219* (2013.01)

(58) Field of Classification Search
CPC .............. H01R 13/639; H01R 13/4365; H01R 13/5219; G01R 1/0416; H01M 8/04552
USPC .................................................. 439/296, 717
See application file for complete search history.

(56) References Cited

U.S. PATENT DOCUMENTS

| | | | | | |
|---|---|---|---|---|---|
| 4,718,858 | A | * | 1/1988 | Godfrey ................. | G06F 1/181 361/732 |
| 4,923,411 | A | * | 5/1990 | Hayashi ............... | H01R 13/518 439/540.1 |
| 5,122,077 | A | * | 6/1992 | Maejima ............... | H01R 13/514 439/398 |
| 5,288,251 | A | * | 2/1994 | Sumida ................. | H01R 13/514 439/701 |
| 5,326,279 | A | * | 7/1994 | Sumida ................ | H01R 13/436 439/157 |
| 5,345,170 | A | * | 9/1994 | Schwindt ................ | A46D 1/00 324/750.19 |
| 5,549,490 | A | * | 8/1996 | Buetas ................. | H01R 13/514 439/721 |
| 5,634,824 | A | * | 6/1997 | Yagi ..................... | H01R 13/514 439/701 |
| 5,864,467 | A | * | 1/1999 | Recchia ............... | H05K 5/0021 174/561 |

(Continued)

FOREIGN PATENT DOCUMENTS

GB              2422728 B          1/2009

*Primary Examiner* — Abdullah Riyami
*Assistant Examiner* — Vladimir Imas

(57) ABSTRACT

An electrical connector assembly which has a first connector and a second connector. The first connector and second connector have connector housings with first latching areas extending from the top surfaces of the connector housings and second latching areas extending from the bottom surfaces of the connector housing. Sealing members are positioned proximate wire-receiving faces of the connector housings. Rear seal cover members are positioned in the connector housings. The rear seal cover members are configured to cooperate with the sealing members to prevent the rear seal cover members from being latched to the connector housing when the terminals are not fully inserted into the terminal receiving cavities of the connector housings.

20 Claims, 3 Drawing Sheets

(56) References Cited

U.S. PATENT DOCUMENTS

| | | | | |
|---|---|---|---|---|
| 5,988,511 | A * | 11/1999 | Schmidt | G06F 13/4095 |
| | | | | 235/492 |
| 6,027,360 | A * | 2/2000 | Jenkins | H01R 13/6215 |
| | | | | 439/248 |
| 6,045,404 | A | 4/2000 | Myer | |
| 6,193,550 | B1 * | 2/2001 | Yamashita | H01R 13/514 |
| | | | | 439/594 |
| 6,371,788 | B1 * | 4/2002 | Bowling | H01R 13/518 |
| | | | | 439/358 |
| 7,297,032 | B2 * | 11/2007 | Kobayashi | H01R 13/4361 |
| | | | | 439/595 |
| 7,445,471 | B1 * | 11/2008 | Scherer | H01R 13/506 |
| | | | | 439/108 |
| 8,287,306 | B2 * | 10/2012 | Daugherty | H01R 13/6315 |
| | | | | 439/540.1 |
| 8,323,046 | B1 * | 12/2012 | Daugherty | H01R 13/639 |
| | | | | 439/352 |
| 8,915,758 | B2 * | 12/2014 | Shishikura | H01R 13/506 |
| | | | | 439/701 |
| 9,039,462 | B2 * | 5/2015 | Yoon | H01R 13/62 |
| | | | | 439/752 |
| 9,972,938 | B2 * | 5/2018 | Imai | H01R 13/514 |

\* cited by examiner

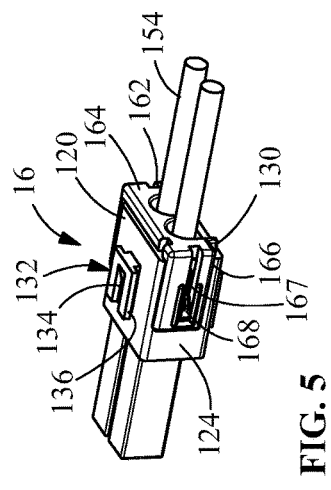
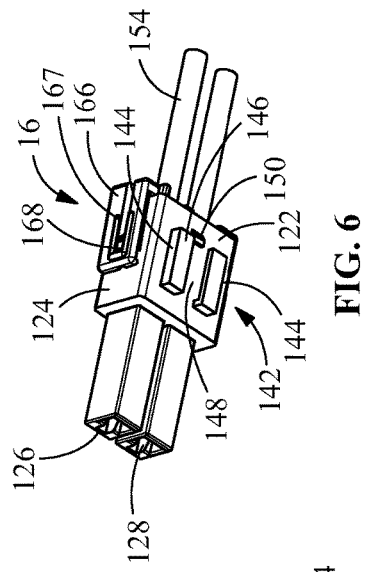
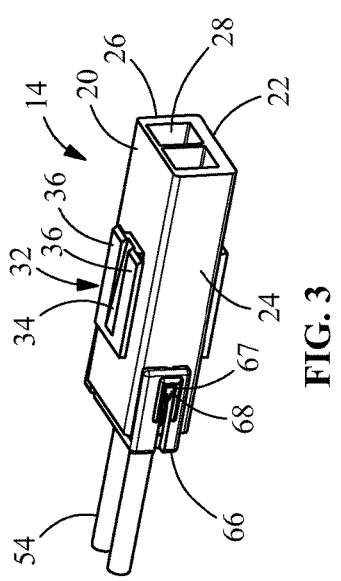
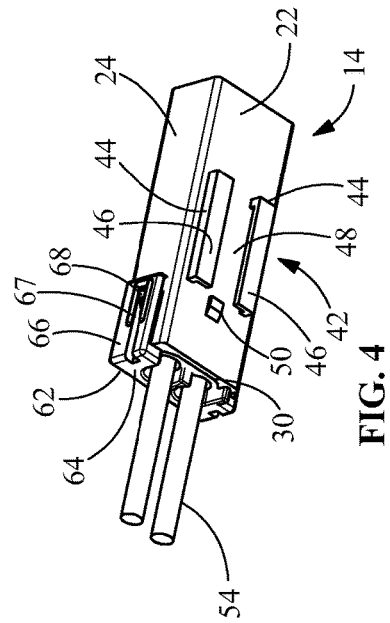
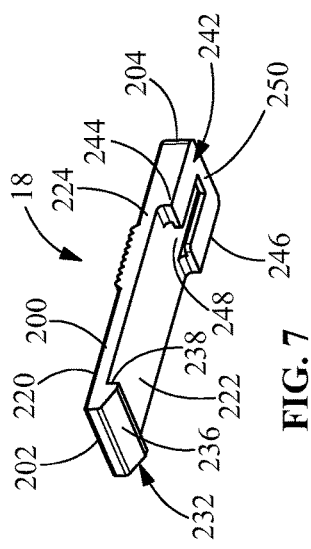

STACKING ELECTRICAL CONNECTOR

FIELD OF THE INVENTION

The present invention relates to stacked electrical connectors. More specifically, the present invention relates to stacked electrical connectors with rear seal cover members.

BACKGROUND OF THE INVENTION

In several different industries and for a wide variety of applications, electrical connector designs are standardized on various different harnesses or on various different discrete ends of a particular harness. The need for standardization of electrical connectors for a particular harness design is particularly true in the automotive industry.

The electrical connectors for these harness assemblies have been proposed having various features to afford a secure mechanical and electrical engagement with a mating electrical connector or other mateable connecting devices. In many applications, the connector includes numerous electrical terminals or contacts. Often, these connectors include housings having rows of terminal cavities. The housings are stacked together to form the connector. In some connectors, the terminals may be assembled into each housing before the housings are assembled together to build the connector. One problem with this type of connector is that the assembled connector must be constructed to a high degree of precision to assure proper alignment with a mating connector. Additionally, the proper installation of each terminal within a corresponding cavity in each housing must be assured.

In addition, the number of terminals required in a harness assembly may change over time. In various applications, as various components are added to the system, there is a need to provide additional power or signal terminals.

Therefore, it would be beneficial to provide a stacked electrical connector which is modular and expandable, and which assures a precise mating of each housing forming the connector. In addition, it would be beneficial to provide a stacked electrical connector which can be sealed.

SUMMARY OF THE INVENTION

An embodiment is directed to an electrical connector assembly which has a first connector and a second connector. The first connector includes a first connector housing having first terminal receiving cavities configured to receive first electrical terminals. The first connector housing has a first latching area extending from a top surface of the first connector housing and a second latching area extending from a bottom surface of the first connector housing. The second connector includes a second connector housing having second terminal receiving cavities configured to receive second electrical terminals. The second connector housing has a first latching area extending from a top surface of the second connector housing and a second latching area extending from a bottom surface of the second connector housing. Sealing members are positioned proximate wire-receiving faces of the first connector housing and the second connector housing. Rear seal cover members are positioned on the first connector housing and the second connector housing. The rear seal cover members are configured to cooperate with the sealing members to maintain the sealing members in position in the first connector housing and the second connector housing.

An embodiment is directed to an electrical connector assembly which includes stacked male connectors and stacked female connectors. The stacked male connectors have a first male connector having a first male connector housing. The first male connector housing has a first male latching area extending from a top surface of the first male connector housing and a second male latching area extending from a bottom surface of the first male connector housing. The stacked male connectors have a second male connector having a second male connector housing. The second male connector housing has a first male latching area extending from a top surface of the second male connector housing and a second male latching area extending from a bottom surface of the second connector housing. The stacked female connectors have a first female connector having a first female connector housing. The first female connector housing has a first female latching area extending from a top surface of the first female connector housing and a second female latching area extending from a bottom surface of the first female connector housing. The stacked female connectors have a second female connector having a second female connector housing. The second female connector housing has a first female latching area extending from a top surface of the second female connector housing and a second female latching area extending from a bottom surface of the second connector housing. The first male latching area of the first male connector housing engages the second male latching area of the second male connector housing to form the stacked male connectors, the first female latching area of the first female connector housing engages the second female latching area of the second female connector housing to form the stacked female connectors.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIG. 3 is a perspective top view of an illustrative female connector of FIG. 2.

FIG. 4 is a perspective bottom view of the illustrative female connector of FIG. 3.

FIG. 5 is a perspective top view of an illustrative male connector of FIG. 2.

FIG. 6 is a perspective bottom view of the illustrative male connector of FIG. 5.

FIG. 7 is a perspective bottom view of an illustrative latching arm of FIG. 2.

DETAILED DESCRIPTION OF THE INVENTION

Figure 1:
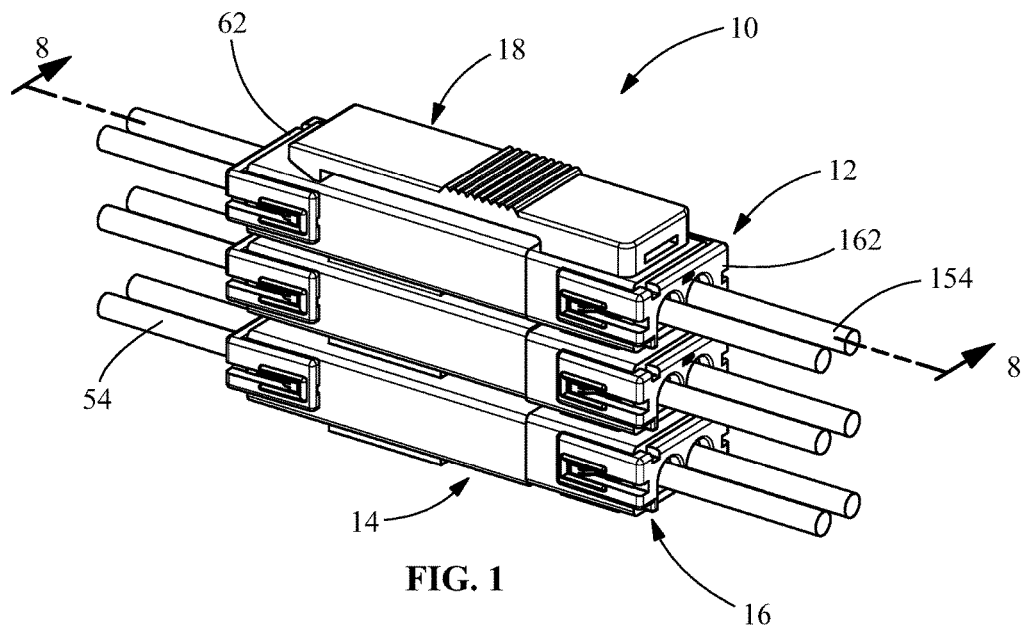
FIG. 1 is a perspective view of an illustrative embodiment of a stacked assembly with three illustrative connector assemblies latched together.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features, the scope of the invention being defined by the claims appended hereto.

Referring to the illustrative embodiment shown in FIG. 1, a stacked assembly 10 is shown. The stacked assembly 10 includes connector assemblies 12 which are latched together. In the illustrative embodiment shown, three connector assemblies 12 are latched or joined together to form the stacked assembly 10. Each connector assembly includes a female connector 14 and a mating male connector 16. However, other types of connectors can be used. A latch arm 18 extends between a respective female connector 14 and male connector 16 to retain the connector assemblies 12 in the mated position, as shown in FIG. 1.

Figure 8:
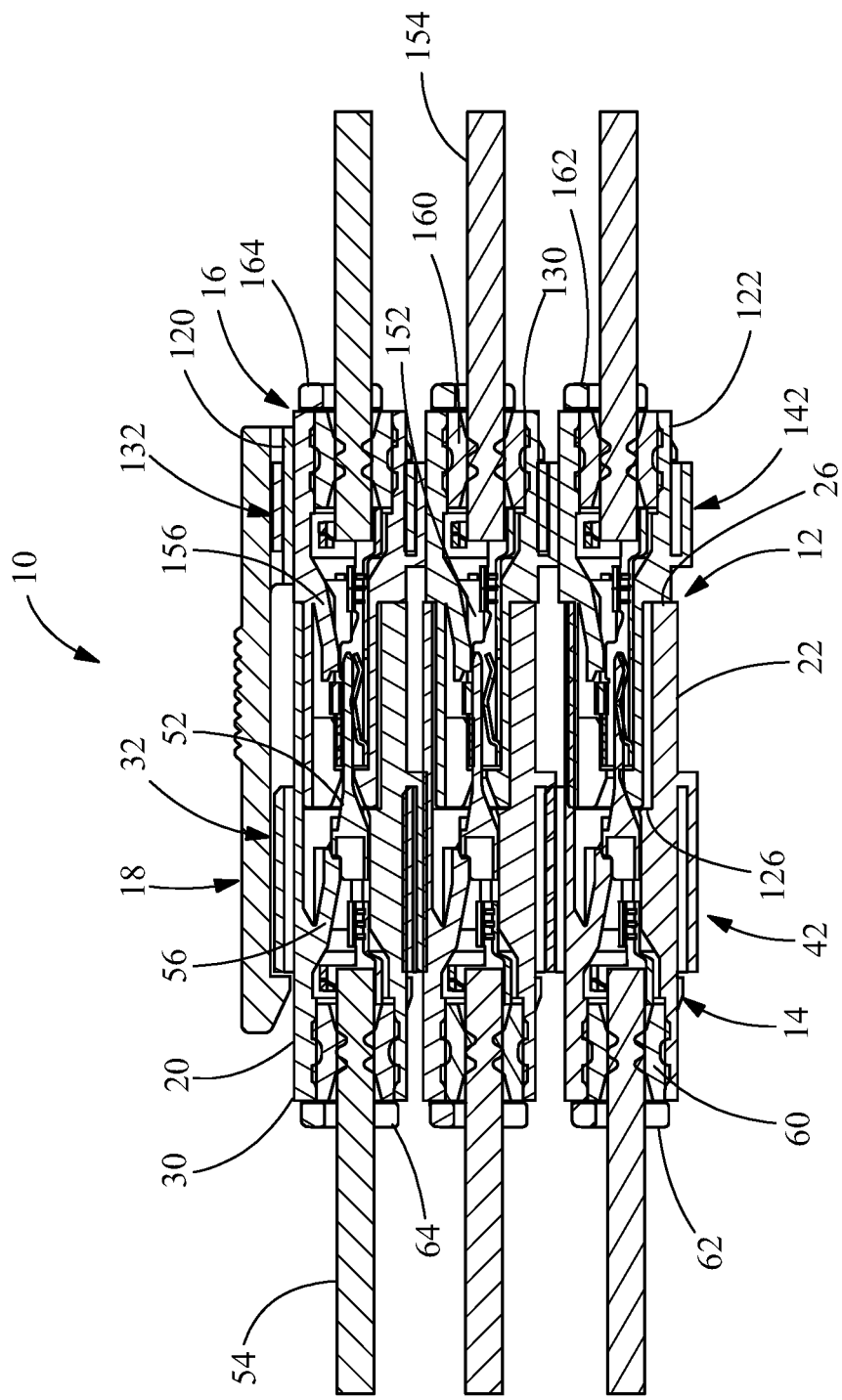
FIG. 8 is a cross-sectional view of the stacked assembly taken along line 8-8 of FIG. 1.

Referring to FIGS. 3, 4 and 8, a representative female connector 14 is shown. The female connector 14 has a top surface or wall 20, an oppositely facing bottom surface or wall 22 and side surfaces or walls 24 which extend between the top wall 20 and the bottom wall 22. A forward mating face 26 extends between top wall 20, bottom wall 22 and side walls 24. Terminal-receiving cavities 28 extend from the mating face 26 to a wire-receiving face 30.

A first latching area 32 extends from the top wall 20. In the illustrative embodiment shown, the first latching area 32 is positioned approximately midway between the mating face 26 and the wire-receiving face 30. However, the first latching area 32 may be positioned in other locations along the top wall 20. In the illustrative embodiment shown, the first latching area 32 includes a resiliently deformable arm 34 which extends from the top wall 20. Engagement arms 36 extend from the resiliently deformable arm 34. The engagement arms 36 are positioned on either side of the resiliently deformable arm 34 and are spaced from the top wall 20. The engagement arms 36 extend in a direction which is essentially parallel to the top wall 20. However, other configurations of the engagement arms 36 may be used. The first latching area 32 is configured to cooperate with other female connectors, as will be more fully described.

A second latching area 42 extends from the bottom wall 22. In the illustrative embodiment shown, the second latching area 42 is positioned approximately midway between the mating face 26 and the wire-receiving face 30. However, the second latching area 42 may be positioned in other locations along the bottom wall 20. In many embodiments the first latching area 32 and the second latching area 42 will be positioned the same distance from the mating face 26. In the illustrative embodiment shown, the second latching area 42 includes latch-receiving projections 44 which extend from the bottom wall 22. The latch-receiving projections 44 have L-shaped configurations with portions 46 of the latch-receiving projections 44 extending in a direction which is essentially parallel to the bottom wall 22. However, other configurations of the latch-receiving projections 44 may be used. The latch-receiving projections 44 form a latch-receiving slot 48 which is configured to cooperate with other female connectors, as will be more fully described. A retaining projection 50 is provided proximate the latch-receiving slot 48.

As best shown in FIG. 8, terminals 52, which are physically and electrically connected to conductors 54, are inserted into the terminal-receiving cavities 28 and are retained therein by resilient terminal latching arms 56. The particular configuration of the terminals 52 and the resilient terminal latching arms 56 are shown for illustrative purposes but may vary.

A sealing member 60 is provided proximate the rear wire-receiving face 30. The sealing member 60 is made of any material which prevents moisture or contaminants from entering the female connector 14 through gaps where conductors 54 enter the rear wire-receiving face 30 of the connector 14. For example, the sealing member 60 may be made from elastomeric material such as silicon rubber.

A rear seal cover member 62 is positioned proximate the rear wire-receiving face 30. The rear seal cover member 62 is a separate molded member with a seal engaging portion 64 and two resilient latching arms 66 (shown in FIGS. 3 and 4) which extend from either side of the seal engaging portion 64. When moved into position proximate the rear wire-receiving face 30, the seal engaging portion 64 spans the rear wire-receiving face 30 and is dimensioned to engage an end of the seal 60. Latch receiving openings 67 of the resilient latching arms 66 are configured to receive cover latching members 68 positioned on the side walls 24. The cooperation of the resilient latching arms 66 with the cover latching members 68 secures the rear seal cover member 62 to the connector 14, thereby preventing the unwanted removal of the rear seal cover member 62 from the connector 14. The rear seal cover member 62 is positioned over the rear wire-receiving face 30 after the terminals 52 and sealing member 60 have been inserted into the terminal-receiving cavities 28 to maintain the sealing member 60 and terminals 52 in position in the female connector 14.

Referring to FIGS. 5, 6 and 8, a representative male connector 16 is shown. The male connector 16 has a top surface or wall 120, an oppositely facing bottom surface or wall 122 and side surfaces or walls 124 which extend between the top wall 120 and the bottom wall 122. Terminal-receiving cavities 128 extend from a mating face 126 to a wire-receiving face 130.

A first latching area 132 extends from the top wall 120. In the illustrative embodiment shown, the first latching area 132 is positioned between the mating face 126 and the wire-receiving face 130. However, the first latching area 132 may be positioned in other locations along the top wall 120. In the illustrative embodiment shown, the first latching area 132 includes a resiliently deformable arm 134 which extends from the top wall 120. Engagement arms 136 extend from the resiliently deformable arm 134. The engagement arms 136 are positioned on either side of the resiliently deformable arm 134 and are spaced from the top wall 120. The engagement arms 136 extend in a direction which is essentially parallel to the top wall 120. However, other configurations of the engagement arms 136 may be used. The first latching area 132 is configured to cooperate with other male connectors, as will be more fully described.

A second latching area 142 extends from the bottom wall 122. In the illustrative embodiment shown, the second latching area 142 is positioned approximately midway between the mating face 126 and the wire-receiving face 130. However, the second latching area 142 may be positioned in other locations along the bottom wall 120. In many embodiments the first latching area 132 and the second latching area 142 will be positioned the same distance from the mating face 126. In the illustrative embodiment shown, the second latching area 142 includes latch-receiving projections 144 which extend from the bottom wall 122. The latch-receiving projections 144 have L-shaped configurations with portions 146 of the latch-receiving projections 144 extending in a direction which is essentially parallel to the bottom wall 122. However, other configurations of the latch-receiving projections 144 may be used. The latch-receiving projections 144 form a latch-receiving slot 148 which is configured to cooperate with other female connectors, as will be more fully described. A retaining projection 150 is provided proximate the latch-receiving slot 148.

As best shown in FIG. 8, terminals 152, which are physically and electrically connected to conductors 154, are inserted into the terminal-receiving cavities 128 and are retained therein by resilient terminal latching arms 156. The particular configuration of the terminals 152 and the resilient terminal latching arms 156 are shown for illustrative purposes but may vary.

A sealing member 160 is provided proximate the rear wire-receiving face 130. The sealing member 160 is made of any material which prevents moisture or contaminants from entering the male connector 16 through gaps where conductors 154 enter the rear wire-receiving face 130 of the connector 16. For example, the sealing member 160 may be made from elastomeric material such as silicon rubber.

A rear seal cover member 162 is positioned proximate the rear wire-receiving face 130. The rear seal cover member 162 is a separate molded member with a seal engaging portion 164 and two resilient latching arms 166 (shown in FIGS. 5 and 6) which extend from either side of the seal engaging portion 164. When moved into position proximate the rear wire-receiving face 130, the seal engaging portion 164 spans the rear wire-receiving face 130 and is dimensioned to engage an end of the seal 160. Latch receiving openings 167 of the resilient latching arms 166 are configured to receive cover latching members 168 positioned on the side walls 124. The cooperation of the resilient latching arms 166 with the cover latching members 168 secures the rear seal cover member 162 to the connector 16, thereby preventing the unwanted removal of the rear seal cover member 162 from the connector 16. The rear seal cover members 162 are positioned over the rear wire-receiving face 130 after the terminals 152 and sealing member 160 have been inserted into the terminal-receiving cavities 128 to maintain the sealing member 160 and terminals 152 in position in the male connector 16.

Referring to illustrative embodiment shown in FIG. 7, the latch arm 18 has a planar portion 200 with a top surface 220, oppositely facing bottom surface 222 and side surfaces 224 which extend between the top surface 220 and the bottom surface 222. A first latching area 232 extends from the bottom surface 222 proximate to a first end 202. A second latching area 242 extends from the bottom surface 222 proximate to a second end 204.

The first latching area 232 has a lead-in surface 236 and a latching shoulder 238. The first latching area 232 is positioned to engage the first latching area 32 of the female connector 14.

The second latching area 242 is positioned to engage the first latching area 132 of the male connector 16. In the illustrative embodiment shown, the second latching area 242 includes latch-receiving projections 244 which have L-shaped configurations. Portions 246 of the latch-receiving projections 244 extend in a direction which is essentially parallel to the planar member 200. However, other configurations of the latch-receiving projections 244 may be used. The latch-receiving projections 244 form a latch-receiving slot 248 which is configured to cooperate with the first latching area 132 of the male connector 1, as will be more fully described. A retaining wall 250 is provided proximate the latch-receiving slot 248.

Figure 2:
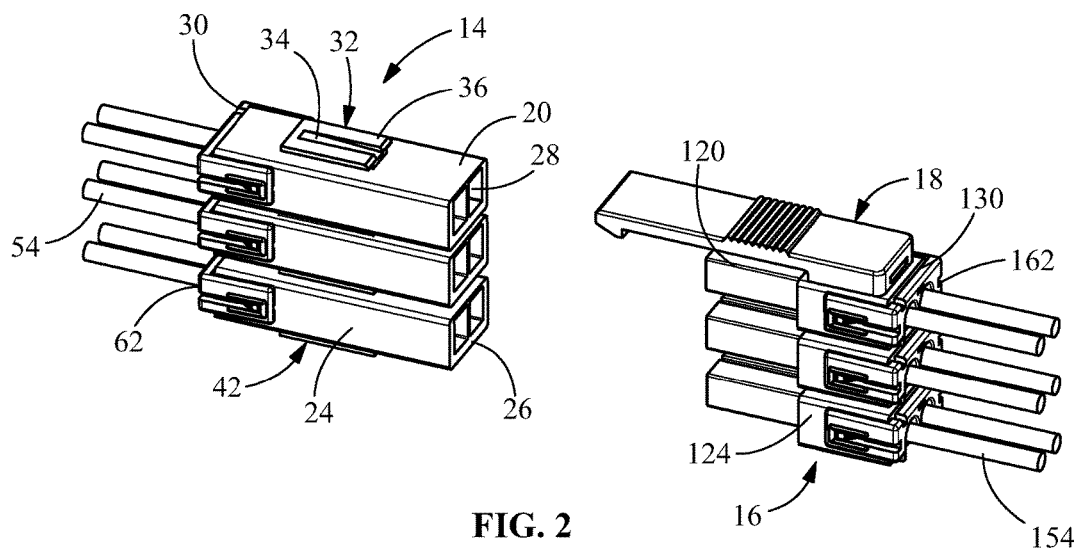
FIG. 2 is a perspective view of the illustrative female connectors and the illustrative male connectors in an unmated position.

To form the illustrative stacked female connectors 14 as shown in FIG. 2, the first latching area 32 of a first respective female connector 14 is mated with the second latching area 42 of a second respective female connector 14. As this occurs, the engagement arms 36 of the first latching area 32 are moved into the latch-receiving slots 48 of the second latching area 42. The insertion of the engagement arms 36 into the latch-receiving slots 48 continues until the engagement arms 36 engage the ends of the latch-receiving projections 44. In this position, the retaining projections 50 and the ends of the latch-receiving projections 44 cooperate maintain the engagement arms 36 in the latch-receiving slots 48, thereby maintaining the respective female connectors 14 in position relative to each other.

The steps in the preceding paragraph are repeated to place three female connectors 14 is the stacking relationship shown in FIG. 2. In other embodiments, the steps are repeated as many times as needed to form the appropriate height stacked female connectors.

To form the illustrative stacked male connectors 16 as shown in FIG. 2, the first latching area 132 of a first respective male connector 16 is mated with the second latching area 142 of a second respective male connector 16. As this occurs, the engagement arms 136 of the first latching area 132 are moved into the latch-receiving slots 148 of the second latching area 142. The insertion of the engagement arms 136 into the latch-receiving slots 148 continues until the engagement arms 136 engage the ends of the latch-receiving projections 144. In this position, the retaining projections 150 and the ends of the latch-receiving projections 144 cooperate to maintain the engagement arms 136 in the latch-receiving slots 148, thereby maintaining the respective male connectors 16 in position relative to each other.

The steps in the preceding paragraph are repeated to place three male connectors 16 is the stacking relationship shown in FIG. 2. In other embodiments, the steps are repeated as many times as needed to form the appropriate height stacked male connectors.

The latch arm 18 is inserted onto the upper to top male connector 16. As this occurs, the second latching area 242 of a latch arm 18 is mated with the first latching area 132 of the male connector 16. As this occurs, the engagement arms 136 of the first latching area 132 are moved into the latch-receiving slots 248 of the second latching area 242. The insertion of the engagement arms 136 into the latch-receiving slots 248 continues until the engagement arms 136 engage the retaining wall 250.

With the female connectors 14, the male connectors 16 and the latch arm 18 properly assembled, the female connectors 14 and male connectors 16 are mated, as shown in FIGS. 1 and 8. In this position, the latching shoulder 238 of the first latching area 232 of the latch arm 18 is moved beyond and engages with the first engagement arms 36 of the first latching area 32 of the female connector 14. The cooperation of the latch arm 18 with the top or upper female connector 14 and male connector 16 causes the stacked assembly 10 to be maintained in a mated position, in which the terminals 52, 152 are maintained in electrical engagement. Other latch arms may be provided without departing from the scope of the invention. For example, a second latch arm may also cooperate with the bottom female connector and male connector.

The use of the modular female and male connectors to form the stacked connector assembly allows for an easy and cost-effective manner to expand power or signal requirements. As the modular female and male connectors are modular and are joined together using the latching areas, different housings are not required, thereby minimizing the tooling required. In addition, as the connectors are modular, only one size seal and one size rear seal cover member are needed regardless of the number of terminals needed in the stacked assembly.

While the invention has been described with reference to a preferred embodiment, it will be understood by those skilled in the art that various changes may be made, and equivalents may be substituted for elements thereof without departing from the spirit and scope of the invention of the invention as defined in the accompanying claims. In particular, it will be clear to those skilled in the art that the present invention may be embodied in other specific forms, structures, arrangements, proportions, sizes, and with other elements, materials and components, without departing from the spirit or essential characteristics thereof. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. An electrical connector assembly comprising:
   a first connector having a first connector housing having first terminal receiving cavities configured to receive first electrical terminals, the first connector housing having a first latching area extending from a top surface of the first connector housing and a second latching area extending from a bottom surface of the first connector housing;
   a second connector having a second connector housing having second terminal receiving cavities configured to receive second electrical terminals, the second connector housing having a first latching area extending from a top surface of the second connector housing and a second latching area extending from a bottom surface of the second connector housing;
   sealing members positioned proximate wire-receiving faces of the first connector housing and the second connector housing;
   rear seal cover members positioned on the first connector housing and the second connector housing, the rear seal cover members configured to cooperate with the sealing members to maintain the sealing members in position in the first connector housing and the second connector housing.

2. The electrical connector as recited in claim 1, wherein the first connector and the second connector are identical.

3. The electrical connector as recited in claim 2, wherein the first latching areas have resiliently deformable arms which extend from the top surfaces, engagement arms extend from the resiliently deformable arms and are positioned on either side of the resiliently deformable arms.

4. The electrical connector as recited in claim 3, wherein the engagement arms are spaced from the top surfaces and extend in a direction which is essentially parallel to the top surfaces.

5. The electrical connector as recited in claim 4, wherein the second latching area have latch-receiving projections which extend from the bottom surfaces.

6. The electrical connector as recited in claim 5, wherein the latch-receiving projections have L-shaped configurations with portions of the latch-receiving projections extending in a direction which is essentially parallel to the bottom surfaces.

7. The electrical connector as recited in claim 6, wherein the latch-receiving projections form latch-receiving slots which are configured to receive the engagement arms of an adjacent connectors therein.

8. The electrical connector as recited in claim 7, wherein retaining projections are provided proximate the latch-receiving slots.

9. The electrical connector as recited in claim 8, wherein the first latching areas and the second latching areas are positioned approximately midway between mating faces of the first and second connector housings and the wire-receiving faces.

10. An electrical connector assembly comprising:
    stacked male connectors and stacked female connectors;
    the stacked male connectors have a first male connector having a first male connector housing with a first male latching area extending from a top surface of the first male connector housing and a second male latching area extending from a bottom surface of the first male connector housing;
    the stacked male connectors have a second male connector having a second male connector housing having a first male latching area extending from a top surface of the second male connector housing and a second male latching area extending from a bottom surface of the second connector housing;
    the stacked female connectors have a first female connector having a first female connector housing with a first female latching area extending from a top surface of the first female connector housing and a second female latching area extending from a bottom surface of the first female connector housing;
    the stacked female connectors have a second female connector having a second female connector housing having a first female latching area extending from a top surface of the second female connector housing and a second female latching area extending from a bottom surface of the second connector housing;
    the first male latching area of the first male connector housing engages the second male latching area of the second male connector housing to form the stacked male connectors, the first female latching area of the first female connector housing engages the second female latching area of the second female connector housing to form the stacked female connectors.

11. The electrical connector assembly as recited in claim 10, wherein a latch arm is inserted into the first male latching area of the second male connector housing.

12. The electrical connector assembly as recited in claim 11, wherein the latch arm engages the first female latching area of the second female connector housing.

13. The electrical connector assembly as recited in claim 12, wherein the first male connector and the second male connector are identical, and the first female connector and the second female connector are identical.

14. The electrical connector as recited in claim 13, wherein the second male latching areas and the second female latching areas have latch-receiving projections which extend from the bottom surfaces.

15. The electrical connector as recited in claim 14, wherein the latch-receiving projections have L-shaped configurations with portions of the latch-receiving projections extending in a direction which is essentially parallel to the bottom surfaces.

16. The electrical connector as recited in claim 15, wherein the first male latching areas and the first male latching areas have resiliently deformable arms which extend from the top surfaces, engagement arms extend from the resiliently deformable arms and are positioned on either side of the resiliently deformable arms.

17. The electrical connector as recited in claim 16, wherein the engagement arms are spaced from the top surfaces and extend in a direction which is essentially parallel to the top surfaces.

18. The electrical connector as recited in claim 17, wherein the latch-receiving projections of the second male latching areas and the second female latching areas form latch-receiving slots which are configured to receive the engagement arms of an adjacent connectors therein.

19. The electrical connector as recited in claim 18, wherein retaining projections are provided proximate the latch-receiving slots.

20. The electrical connector as recited in claim 18, wherein the first male latching areas and the second male latching areas are positioned approximately midway between male connector housing mating faces and male connector housing wire-receiving faces and the first female latching areas and the second female latching areas are positioned approximately midway between female connector housing mating faces and female connector housing wire-receiving faces.

* * * * *